(12) United States Patent
Trovarelli et al.

(10) Patent No.: US 7,169,647 B2
(45) Date of Patent: Jan. 30, 2007

(54) CONNECTION BETWEEN A SEMICONDUCTOR CHIP AND AN EXTERNAL CONDUCTOR STRUCTURE AND METHOD FOR PRODUCING IT

(75) Inventors: Octavio Trovarelli, Dresden (DE); Ingo Uhlendorf, Dresden (DE); David Wallis, Dresden (DE); Axel Brintzinger, Dresden (DE)

(73) Assignee: Infineon Technologies AG, Munich (DE)

( * ) Notice: Subject to any disclaimer, the term of this patent is extended or adjusted under 35 U.S.C. 154(b) by 42 days.

(21) Appl. No.: 10/842,259

(22) Filed: May 7, 2004

(65) Prior Publication Data

US 2004/0248341 A1    Dec. 9, 2004

(30) Foreign Application Priority Data

May 7, 2003    (DE)    ................ 103 20 561

(51) Int. Cl.
*H01L 21/44* (2006.01)
*H01L 21/48* (2006.01)
*H01L 21/50* (2006.01)

(52) U.S. Cl. .............. 438/118; 438/455; 257/E21; 257/21

(58) Field of Classification Search ............... 438/118, 438/106, 119, 455, 612, 613
See application file for complete search history.

(56) References Cited

U.S. PATENT DOCUMENTS 4,372,809 A    2/1983    Grewal et al.
6,125,043 A *    9/2000    Hauer et al. ............... 361/760
6,664,130 B2 *    12/2003    Akram ....................... 438/108
6,844,253 B2 *    1/2005    Farrar ......................... 438/612
6,851,598 B2 *    2/2005    Gebauer et al. ....... 228/180.22
6,891,248 B2 *    5/2005    Akram et al. .............. 257/532
2001/0013851 A1    8/2001    Nakazawa
2003/0067755 A1    4/2003    Haimerl et al.

FOREIGN PATENT DOCUMENTS

| DE | 3107943 C2 | 9/1982 |
| DE | 3407784 C2 | 9/1985 |
| DE | 19750073 A1 | 5/1999 |
| EP | 0295914 A2 | 12/1988 |
| WO | WO 01/75969 A1 | 10/2001 |

* cited by examiner

*Primary Examiner*—David Nhu
(74) *Attorney, Agent, or Firm*—Slater & Matsil, L.L.P.

(57) ABSTRACT

A conductive connection is made between a semiconductor chip and an external conductor structure. An elevation element is applied on the surface of the semiconductor chip and a soldering island is arranged on the elevation element. An interconnect is produced below the soldering island as far as a bonding island or an I/O pad. Increased reliability of conductive connections of the bonding island or the I/O pad to an external conductive structure can be achieved by preventing the flowing-away of the solder and the oxidation or corrosion of the conductive layer.

13 Claims, 8 Drawing Sheets

FIG 6.A
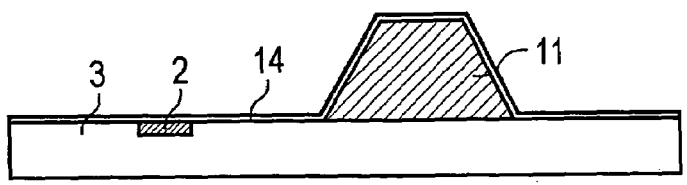
FIG 6.B
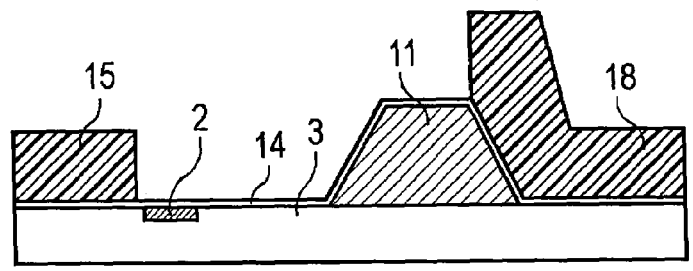
FIG 6.C
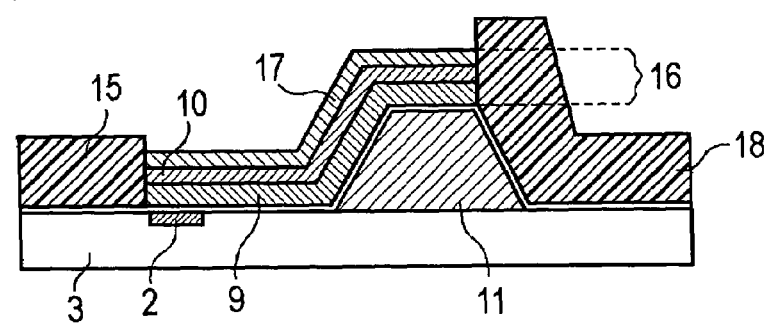
FIG 6.D
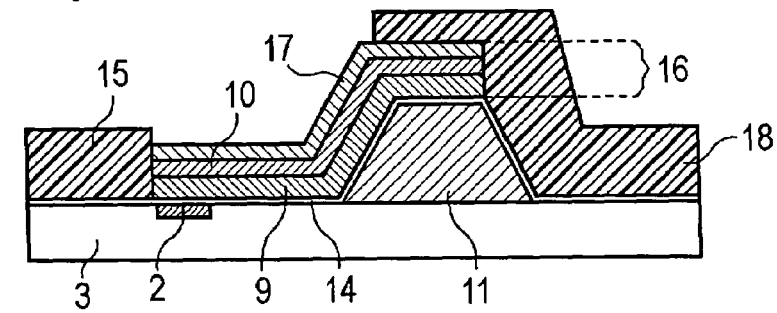
FIG 6.E
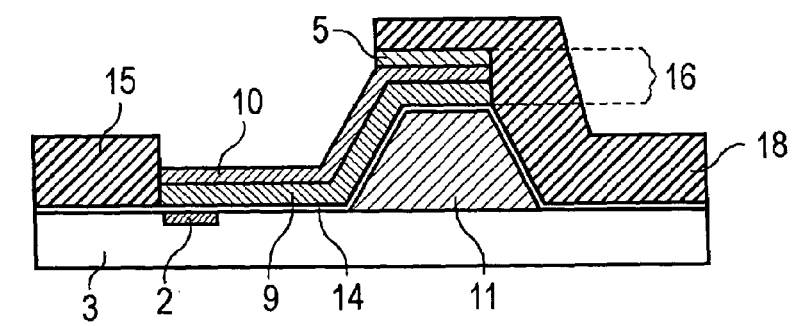
FIG 6.F
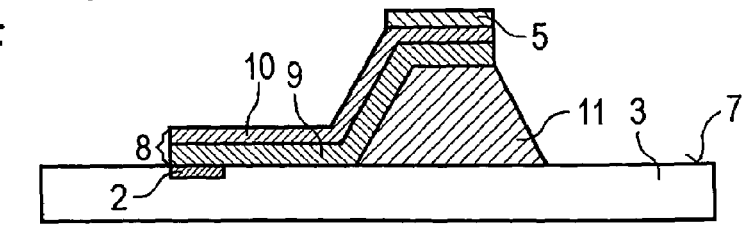

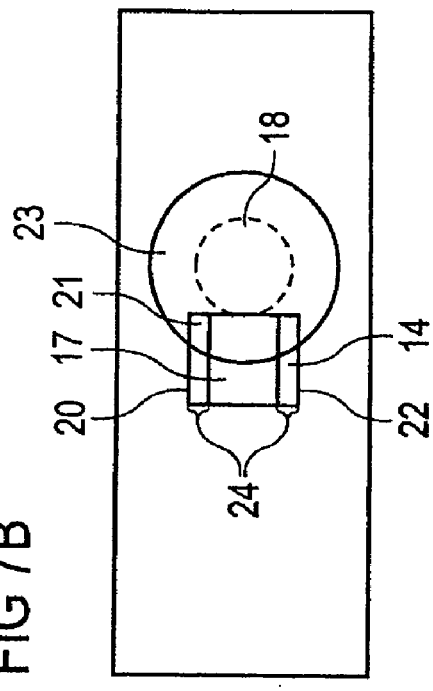
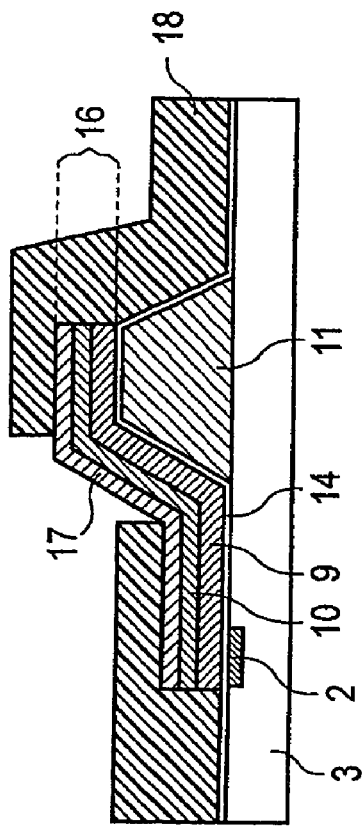
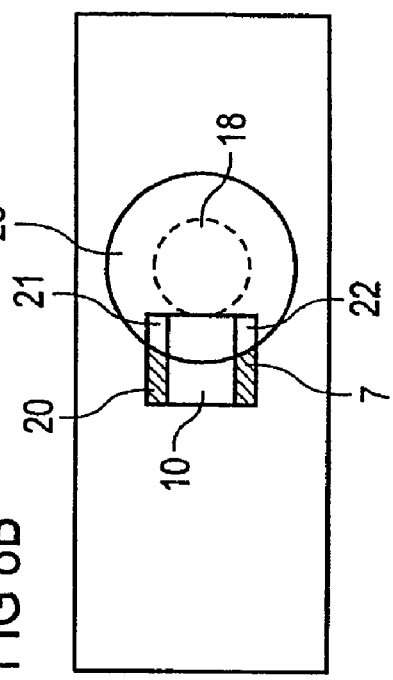
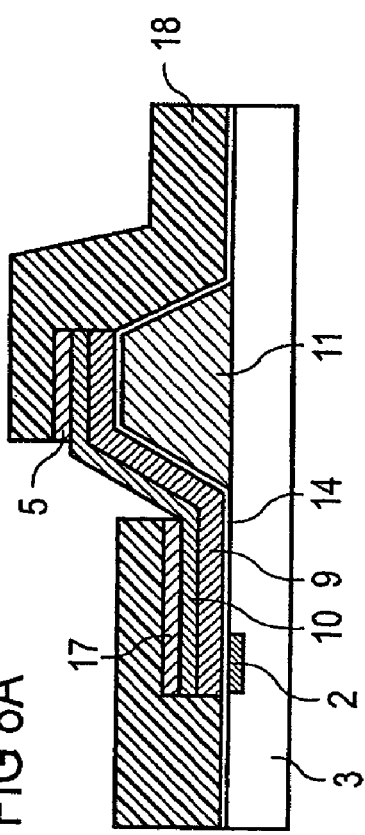

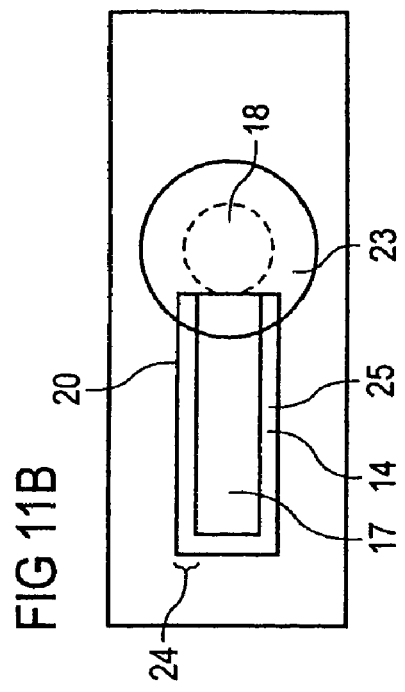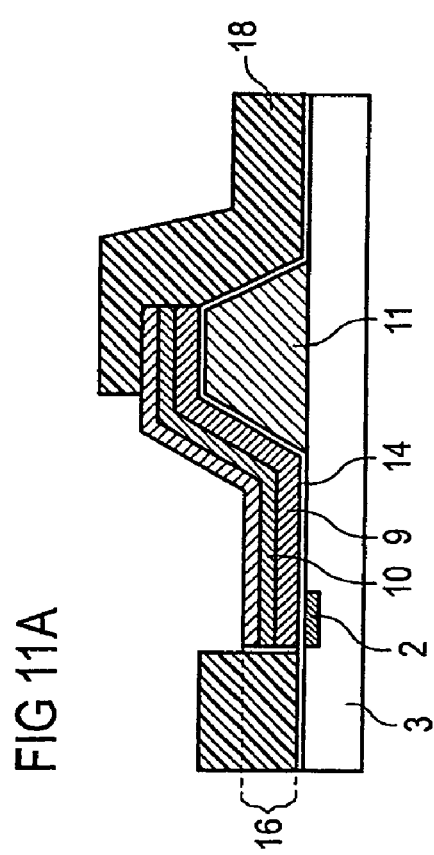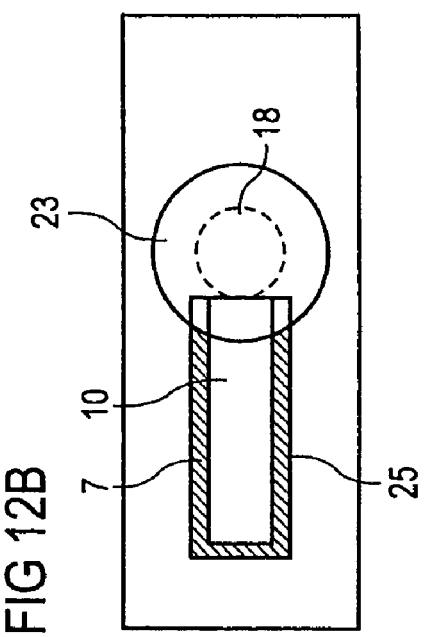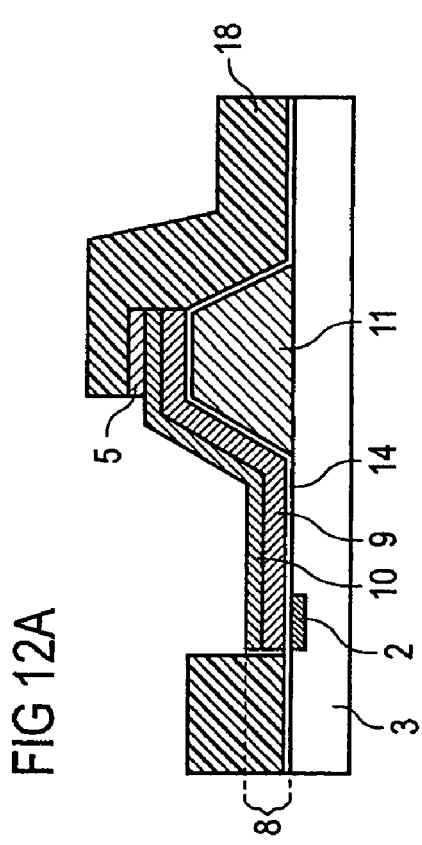

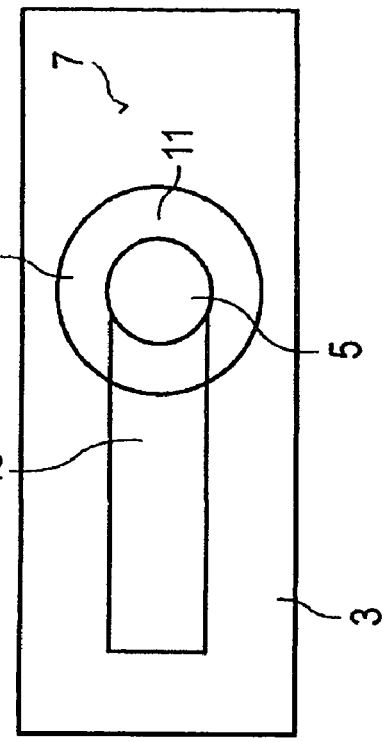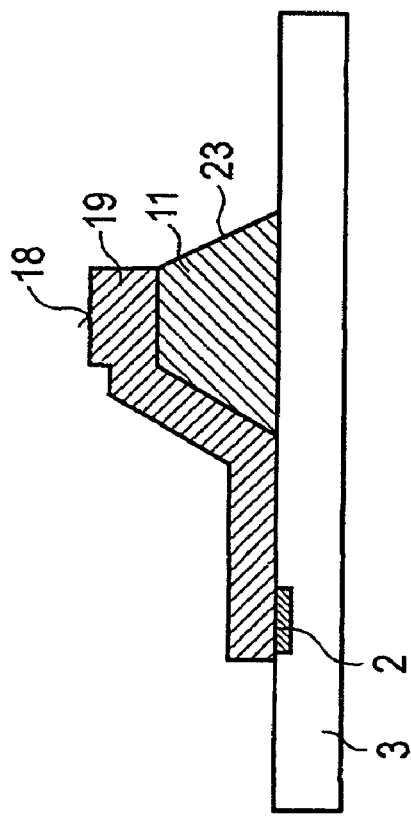

CONNECTION BETWEEN A SEMICONDUCTOR CHIP AND AN EXTERNAL CONDUCTOR STRUCTURE AND METHOD FOR PRODUCING IT

TECHNICAL FIELD

The present invention relates generally to electronic devices and the preferred embodiment relates to a connection between a semiconductor chip and an external conductor structure and method for producing it.

BACKGROUND

In order to produce a conductive connection between a bonding island or an I/O pad on a semiconductor chip and an external conductor structure, it is known to provide soldering islands on the chip. The external conductor structure is then soldered onto the soldering island by means of a solder.

The soldering island is arranged in elevated fashion on the surface of the semiconductor chip on the topside of an elevation element and comprises readily solderable non-oxidizing metal, in particular comprising gold. For its part, the soldering island is electrically conductively connected to the bonding island or the I/O pad via an interconnect which lies below the soldering island and runs right over the bonding island or the I/O pad.

The interconnect comprises a bottommost conductive layer, in particular comprising copper, and a conductive first passivation layer deposited thereon, in particular comprising nickel. The soldering island is then arranged on the first passivation layer. The basis of the elevation is formed by an elevation element below the soldering island. The first passivation layer serves, on the one hand, to prevent oxidation on the topside of the conductive layer. On the other hand, the first passivation layer serves as a solder stop which prevents a flowing-away of the solder on the topside of the interconnect from the level of the soldering island downwards.

This conductive connection is produced by firstly depositing a nucleation layer on the entire surface of the semiconductor wafer, which nucleation layer, in subsequent process steps, serves as an electrode for the electrolytic deposition of the metal layers of the interconnect and the soldering island. A first resist mask that frees the later structure of the interconnect is subsequently produced. The nucleation layer is thus uncovered in the region of the interconnect to be produced. A layer sequence comprising the conductive layer, the first passivation layer and an upper layer made of the material of the later soldering island is subsequently deposited by application of a corresponding voltage.

With the first resist mask being retained, the region of the later soldering island is then covered with a second resist mask. The upper layer is now uncovered in the region between the later soldering island and the bonding island or the I/O pad. The upper layer is subsequently removed in this region. Finally, the first and second resist masks and the nucleation layer are removed.

In the case of this method, the conductive layer is covered with the first passivation layer on its topside. The soldering island covers the first passivation layer on the surface thereof. The vertical side areas of the individual layers are uncovered.

In the case of this prior art, it is disadvantageous, on the one hand, that, during the soldering operation, the solder can pass over the side area of the first passivation layer as far as the side area of the conductive layer and be conducted downwards at the side area of the conductive layer. This reduces the quantity of solder at the soldering location, which leads to a reduction of the reliability of the soldering locations. On the other hand, it is disadvantageous that the side areas of the conductive layer can oxidize or corrode, which likewise leads to a reduction of the reliability.

SUMMARY OF THE INVENTION

In one aspect, the present invention relates to a method for producing a conductive connection between a semiconductor chip and an external conductor structure. The preferred embodiment of the invention relates particularly to a method for producing a conductive connection between a semiconductor chip and an external conductor structure, in which an elevation element is applied on a semiconductor wafer on the surface of the semiconductor chip. A nucleation layer is deposited on the elevation element and the remaining surface of the semiconductor wafer and then a first resist mask that frees the later structure of the interconnect is produced. A conductive layer, a first passivation layer and an upper layer, made of the material of the later soldering island, are subsequently produced and the region of the soldering island on the upper layer is covered with a second resist mask. The upper layer is removed in the region that is not covered.

Embodiments of the invention also relate generally to a conductive connection between a semiconductor chip and an external conductor structure with an interconnect applied to a surface of a semiconductor chip.

The preferred embodiment relates particularly to a conductive connection between a semiconductor chip and an external conductor structure with a soldering island, which is arranged in elevated fashion with respect to the surface of the semiconductor chip on the topside of an elevation element and comprises readily solderable non-oxidizing metal, for example comprising gold. The soldering island is electrically conductively connected to a bonding island or an I/O pad via an interconnect that lies below the soldering island and runs over the bonding island or the I/O pad. In this case, the interconnect comprises a bottommost conductive layer and a conductive first passivation layer deposited thereon, on which the soldering island is then arranged.

To overcome disadvantages of the prior art, the preferred embodiment of the invention provides a means of increasing the reliability of conductive connections of a bonding island or an I/O pad to an external conductive structure by preventing the flowing-away of the solder and preventing the oxidation or corrosion of the conductive layer.

In respect of a preferred method, the invention achieves advantages by the fact that areas of the interconnect that are not covered with the semiconductor wafer are covered with a passivating covering layer. This covering layer prevents oxidation and, when using soldering connections, also prevents the flowing away of the solder, independently of the inner structure of the interconnect.

In one expedient form of the method, additional patterning steps are avoided in the realization of the covering layer by virtue of the fact that the covering layer is deposited in a self-aligning manner.

In a further expedient variant of the method according to the invention, it is provided that a nucleation layer is deposited before the application of the interconnect on the surface of the semiconductor wafer at least in the region of the conductive connection to be produced and the covering layer, with contact-connection of the nucleation layer with a potential of an electrolysis voltage, is deposited electrolytically at the free areas of the interconnect.

In one example, the sides of the interconnect are covered with a second passivation layer at least in a region adjoining the soldering island. This second passivation layer makes it possible first of all to prevent a flowing-away of solder, since a passivation layer regularly has poor flow properties for the solder. Since the second passivation layer adjoins the soldering island, it prevents solder from being able to run away from the soldering island and thus reduce the quality of the soldering connection.

In a first refinement of the method, it is provided that the second resist mask covers the semiconductor wafer at least in the region of the conductive connection to be produced apart from a window. This window on the one hand frees the layer sequence—produced with the first resist mask—comprising conductive layer, passivation layer and upper layer. On the other hand, the window frees first and second strips on the surface of the nucleation layer, which in each case adjoin a longitudinal side of the layer sequence. In this case, the window frees the layer sequence at least on a slope region of the elevation. The upper layer and the nucleation layer are subsequently removed in the window and a second passivation layer is then deposited in the window, in particular at the side areas of the interconnect. The second resist mask and the nucleation layer are then removed.

Since the possibility of solder disadvantageously flowing away exists precisely on the slope region, this flowing-away is prevented by this arrangement since, after all, a second passivation layer preventing the flow of solder bears, at least in this region, on the side areas of the interconnect. However, corrosion or oxidation of the side areas of the interconnect is also prevented at least in these regions.

In a development of the method variant, the second resist mask covers the region of the soldering island and the window frees at least the layer sequence and a third strip— which runs around the layer sequence and encloses the first and second strips—on the surface of the nucleation layer laterally with respect to the layer sequence.

In the peripheral third strip, the sidewalls of the interconnect are uncovered and can thus be provided with a second passivation layer. This prevents a possible flowing-away of solder, on the one hand, and achieves complete oxidation protection, on the other hand.

In this case, it is expedient to choose the width of the first, second or third strip to be wider than the width of the interconnect. The sidewalls can thus be coated very reliably. The width of the first, second or third strip is preferably 5 µm to 10 µm.

By virtue of the fact that, by means of the strip or strips, the nucleation layer is removed prior to coating with the second passivation layer in the strip or strips, no passivation layer can grow on the surface of the former nucleation layer in these regions, for which reason it is possible for the second passivation layer to be electrolytically deposited only at the side areas of the conductive layer. The application of the electrolysis voltage to the side areas of the interconnects which are provided for the deposition is effected by that part of the interconnect below the soldering island which is still electrically conductively connected to the nucleation layer. This is because the patterned regions of the nucleation layer below the interconnects are joined with the remaining regions of the nucleation layer on the semiconductor wafer. As a result, the electrolysis voltage is also present at the side areas of the interconnect when the nucleation layer is connected to the electrolysis voltage source somewhere at the semiconductor wafer.

In a second refinement of the method, it is provided that the second resist mask covers the region of the soldering island and frees the layer sequence produced with the first resist mask and the adjoining surface of the nucleation layer. The upper layer and the nucleation layer are subsequently removed in the uncovered regions. The second passivation layer is then deposited, in particular at the side areas of the interconnect, and then the second mask and the nucleation layer are removed.

After the patterning of the second resist mask, the surface of the semiconductor wafer is uncovered here in the regions adjacent to the layer sequence. A nucleation layer no longer exists in these regions for which reason, during the production of the second passivation layer, the latter is positive only on the interconnect, in particular on the side areas thereof.

In the case of this method variant, the deposition of the second passivation layer is expediently effected in a manner free of voltage, i.e. free of an application of an electrolysis voltage (electroless plating).

In respect of the preferred arrangement, advantages are achieved generally by virtue of the fact that areas of the interconnect that are not covered with the semiconductor wafer are coated and completely covered with a passivating covering layer.

In respect of the preferred arrangement, advantages are also achieved particularly by virtue of the fact that a second passivation layer is arranged at the sides of the interconnect at least in a region adjoining the soldering island.

This second passivation layer at least prevents a disadvantageous flowing-away of solder. However, it also prevents oxidation or corrosion at least in the coated regions.

In particular, in order to prevent the flowing-away of solder, it is provided that the second passivation layer is arranged in a slope region of the elevation.

It is possible to ensure complete prevention of oxidation or corrosion and prevention of uncontrolled flowing-away of solder by arranging the second passivation layer on all the side areas of the interconnect.

BRIEF DESCRIPTION OF THE DRAWINGS

For a more complete understanding of the present invention, and the advantages thereof, reference is now made to the following descriptions taken in conjunction with the accompanying drawing, in which:

FIG. 6, which includes FIGS. 6A–6F, shows side views of the resulting conductive connection in process steps 6A to 6F for producing a conductive connection according to the prior art;

FIG. 7, which includes FIGS. 7A and 7B, shows a side view (7A) and a plan view (7B) of the resulting conductive connection in a first process step of a first exemplary embodiment of the invention;

FIG. 8, which includes FIGS. 8A and 8B, shows a side view (8A) and a plan view (8B) of the resulting conductive connection in a second process step of the first exemplary embodiment of the invention;

FIG. 10, which includes

FIG. 11, which includes FIGS. 11A and 11B, shows a side view (11A) and a plan view (11B) of the resulting conductive connection in a first process step of a second exemplary embodiment of the invention;

FIG. 12, which includes FIGS. 12A and 12B, shows a side view (12A) and a plan view (12B) of the resulting conductive connection in a second process step of the second exemplary embodiment of the invention;

FIG. 17, which includes FIGS. 17A and 17B, shows a side view (17A) and a plan view (17B) of the conductive connection after a fourth process step of the third exemplary embodiment of the invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
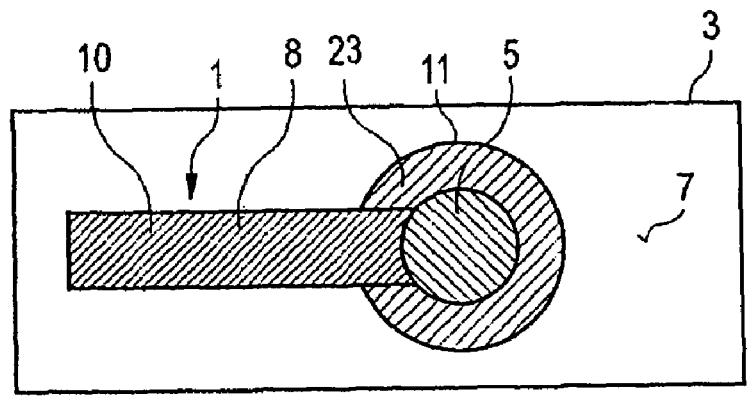
FIG. 1 shows a plan view of a conductive connection according to the prior art.
Figure 2:
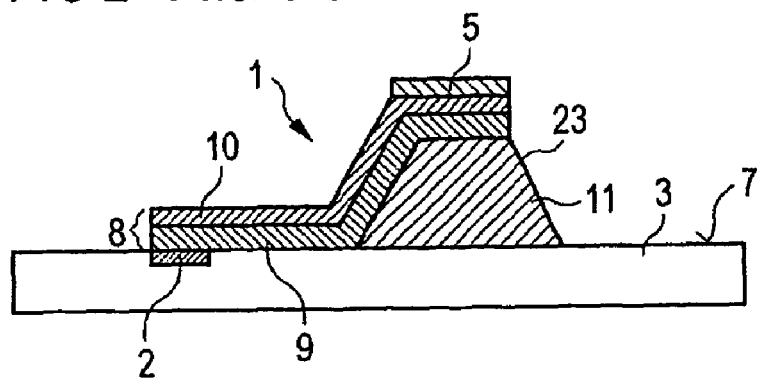
FIG. 2 shows a side view of a conductive connection according to the prior art.
Figure 3:
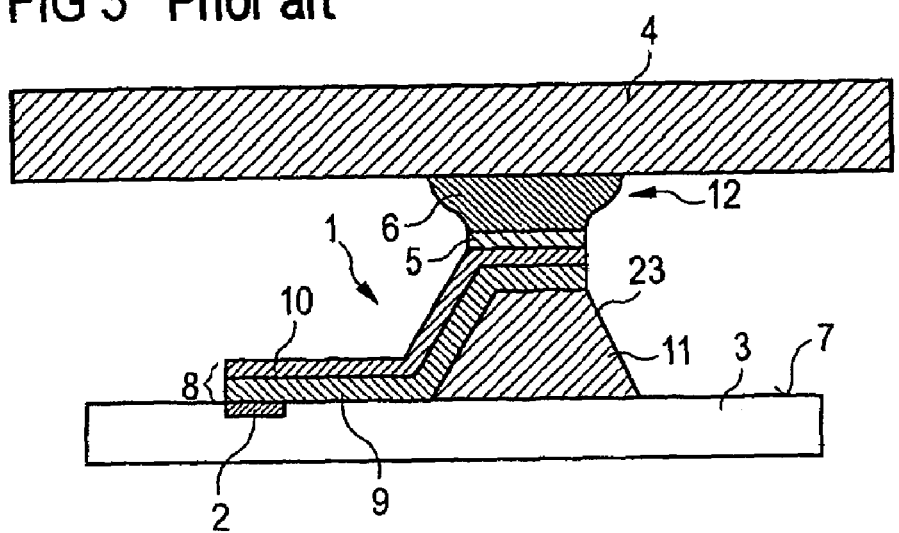
FIG. 3 shows a side view of a conductive connection according to the prior art with an external conductor structure.

As illustrated in FIG. 1 to FIG. 3, a soldering island 5 is provided in order to produce a conductive connection 1 between a bonding island or an I/O pad 2 on a semiconductor chip 3 and an external conductor structure 4. The external conductor structure 4 is then soldered onto the soldering island 5 together with a plurality of identical soldering islands, by means of a solder 6.

The soldering island 5 is arranged in elevated fashion on the surface 7 of the semiconductor chip 3. It comprises readily solderable non-oxidizing metal, comprising gold in this exemplary embodiment. For its part, this soldering island 5 is electrically conductively connected to the bonding island or the I/O pad 2 via an interconnect 8, which lies below the soldering island 5 and runs over the bonding island or the I/O pad 2.

In the preferred embodiment, the interconnect 8 comprises a bottommost conductive layer 9, comprising copper, and a conductive first passivation layer 10 deposited thereon, comprising nickel. The soldering island 5 is then arranged on the first passivation layer 10. The basis of the elevation is formed by an elevation element 11 below the soldering island 5. The first passivation layer 10 serves, on the one hand, to prevent oxidation on the topside of the conductive layer 9. On the other hand, the first passivation layer 10 serves as a diffusion barrier between the material of the conductive layer 9, Cu, and the material of the soldering island 5, comprising Au. However, the first passivation layer 10 also serves as a solder stop, which prevents a flowing-away of the solder 6 on the topside of the interconnect 8 from the level of the soldering island 5 downwards.

Figure 4:
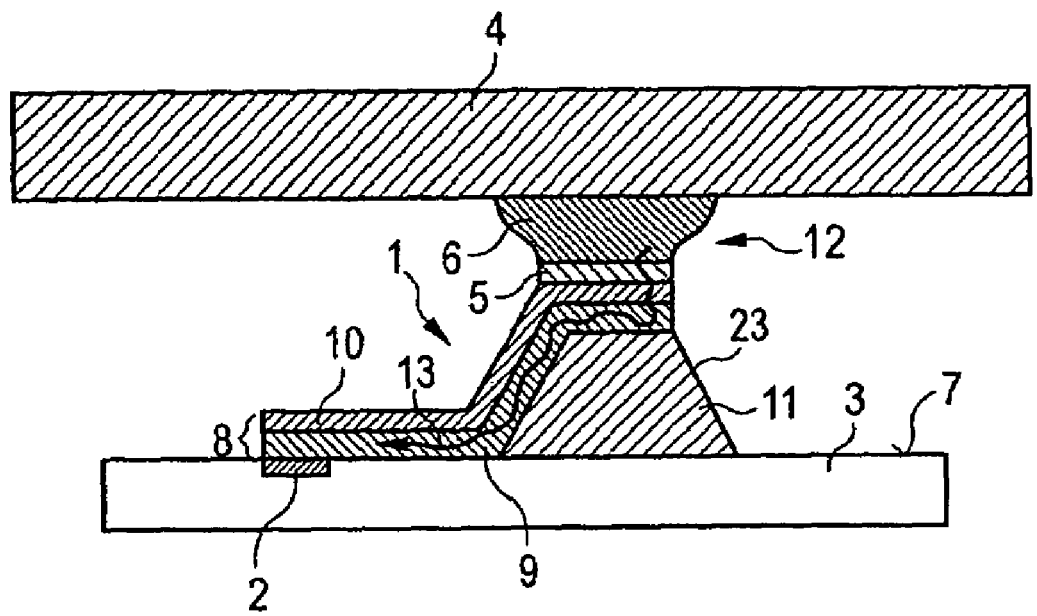
FIG. 4 shows a side view of a conductive connection with an external conductor structure according to the prior art with flowing-away of solder during the soldering operation.
Figure 5:
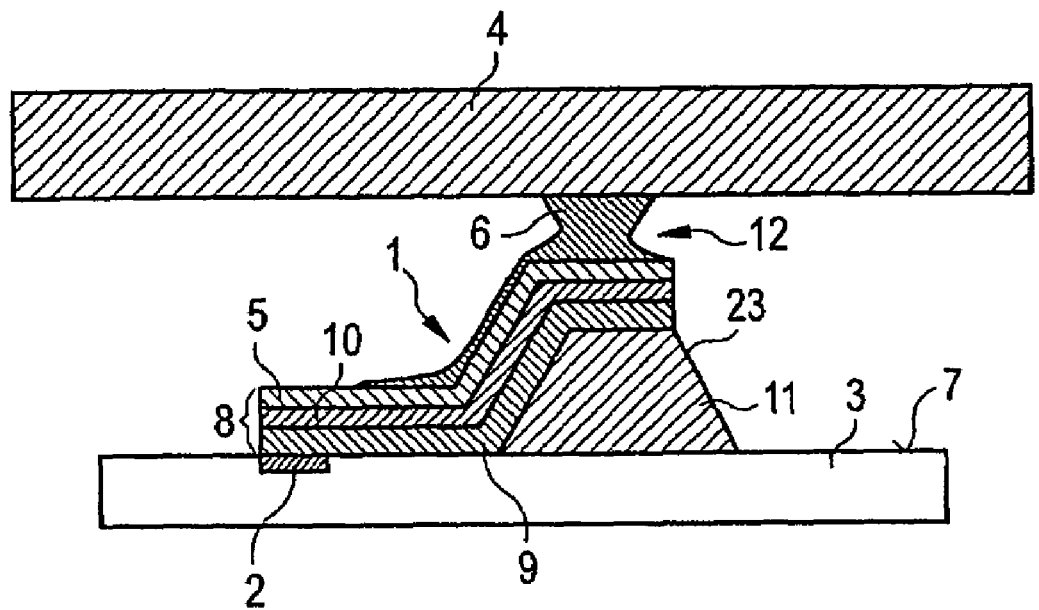
FIG. 5 shows a longitudinal section through the conductive connection according to FIG. 4 after the end of the soldering operation if no solder stop is present.

As illustrated in FIG. 4, the passivation layer 10 is only very narrow at the side areas below the soldering island 5 for preventing the flowing-away of solder 6. Consequently, it is possible for solder 6 to flow away on a path from the soldering location 12 during the soldering operation and thus weaken the soldering location 12, as is illustrated in FIG. 5.

Furthermore, it is disadvantageous that the side areas of the conductive layer 9 are uncovered, as can be seen in FIG. 2 to FIG. 5. It is thus possible for the material of the conductive layer 9, that is to say the copper in the exemplary embodiment, to oxidize which adversely affects the reliability of the conductive connection 1.

As illustrated in FIGS. 6A–6B, the conductive connection 1 according to the prior art is produced by firstly, as shown in FIG. 6A, a nucleation layer 14 being deposited on the surface 7 of the semiconductor chip 3 after the arrangement of the elevation elements 11, which nucleation layer in subsequent process steps, acts as an electrode for the electrolytic deposition of the metal layers of the interconnect 8 and the soldering island 5. A first resist mask 15 that frees the later structure of the interconnect 8 is subsequently produced as shown in FIG. 6B. The nucleation layer 14 is thus uncovered in the region of the interconnect 8 to be produced. As shown in FIG. 6C, the deposition of a layer sequence 16 having the conductive layer 9 made of copper, the first passivation layer 10 made of nickel and the upper layer 17 made of gold is subsequently effected by application of a corresponding voltage.

With the first resist mask 15 being retained, the region of the later soldering island 5 is then covered with a second resist mask 18 as shown in FIG. 6D. The upper layer 17 is now uncovered in the region between the later soldering island 5 and the bonding island or the I/O pad 2. The upper layer 17 is subsequently removed in this region as shown in FIG. 6E. Finally, the first 15 and second resist mask 18 and exposed portions of the nucleation layer 14 are removed in FIG. 6F.

In the case of this method, the conductive layer 9 is covered with the first passivation layer 10 on its topside. The soldering island 5 covers the first passivation layer 10 on the surface thereof. The vertical side areas of the individual layers 9, 10, 17 are uncovered, which entails the disadvantages explained above.

In the preferred embodiment of the invention, the sides of the interconnect 8 are covered with a second passivation layer 19 at least in a region adjoining the soldering island 5. The realization is illustrated below on the basis of three possible configurations of the method according to the invention.

In a first exemplary embodiment, the process steps shown in FIGS. 6D to 6F are replaced by the steps that are illustrated successively in FIGS. 7A–7B to FIGS. 10A–10B. In other words, FIGS. 7A–7B starts at a point where the interconnect, including layers 9, 10 and 17, has been formed. These layers can be copper, nickel and gold, as described above, or other layers. In addition, fewer than three or more than three layers could be included.

As illustrated in FIGS. 7A–7B, the first resist mask 15 is removed and the second resist mask 18 covers the semiconductor wafer and thus the semiconductor chip 3 at least in the region of the conductive connection 1 to be produced except for a window 20, which frees the layer sequence 16 and a first 21 and a second strip 22. In these two strips 21 and 22, the surface of the nucleation layer 14 is in each case uncovered at a longitudinal side of the layer sequence 16. The strips 21 and 22 lie on the slope region 23 of the elevation, which extends from the topside of the elevation element 11 as far as the surface 7 of the semiconductor chip 3. The first 21 and second strip 22 have a width 24 wider than the width of the interconnect 8. In the example illustrated, the width 24 of the first and second strips is 5 μm to 10 μm.

As illustrated in FIGS. 8A–8B, the upper layer 17 and the nucleation layer 14 are subsequently removed in the window 20. The first passivation layer 10 and, in the region of the strips 21 and 22, the surface 7 are now uncovered. This means that no nucleation layer 14 is situated in the strips 21 and 22, which nucleation layer would bring about an electrolytic deposition upon application of an electrolysis voltage, while an electrolysis voltage can be applied to the region of the uncovered first passivation layer 10.

Figure 9:
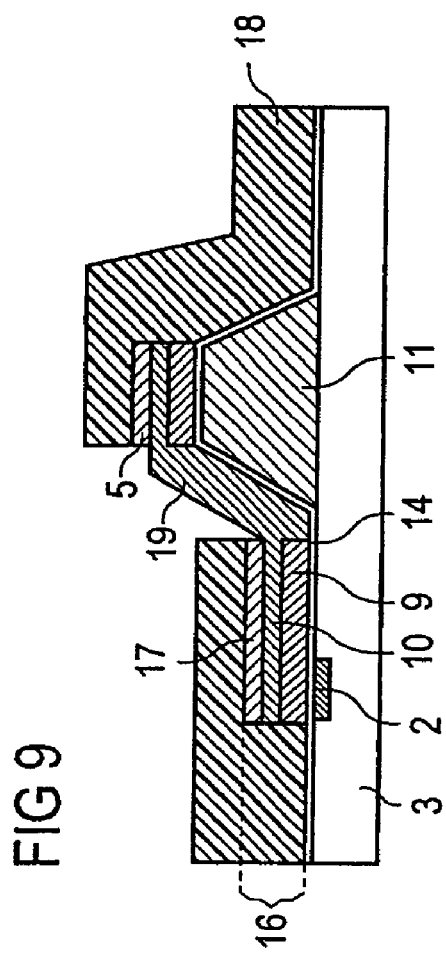
FIG. 9 shows a side view of the resulting conductive connection in a third process step of the first exemplary embodiment of the invention.

As illustrated in FIG. 9, a second passivation layer 19 is thus subsequently deposited electrolytically in the window, in particular at the side areas of the interconnect 8. As such, the sidewalls of conductive layer 9 are covered and thus not visible in FIG. 9. The second passivation layer is preferably a conductor such as nickel.

Figure 10B:
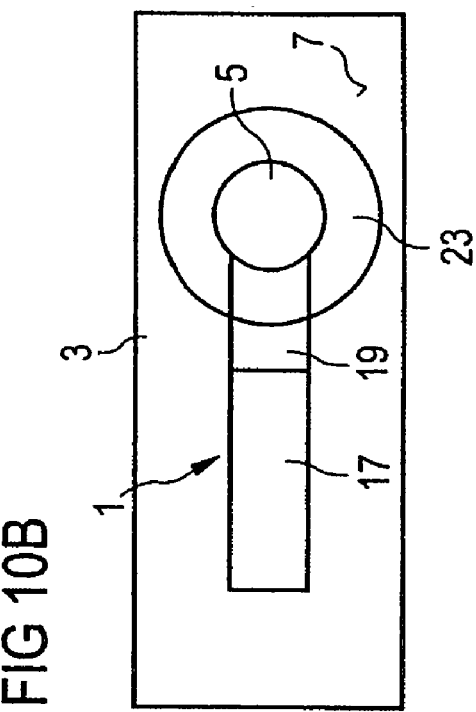
FIGS. 10A and 10B, shows a side view (10A) and a plan view (10B) of the conductive connection after a fourth process step of the first exemplary embodiment of the invention.
Figure 10A:
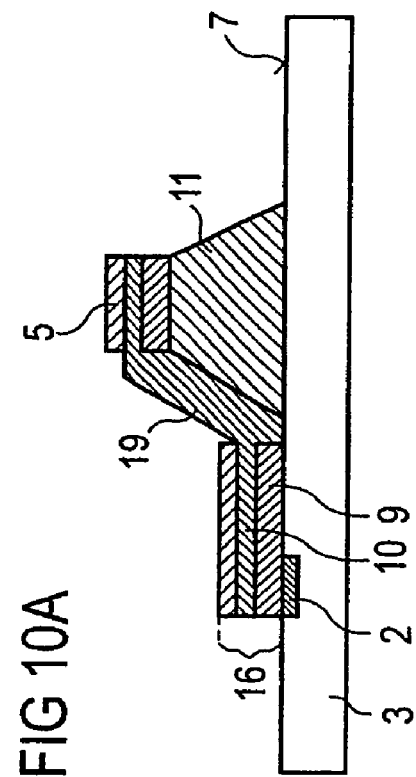

As illustrated in FIGS. 10A–10B, the second resist mask 18 and the exposed portions of nucleation layer 14 are then removed. As a result, in the case of the conductive connection, the second passivation layer 19 is arranged in a slope region 23 of the elevation element 11.

Figure 13:
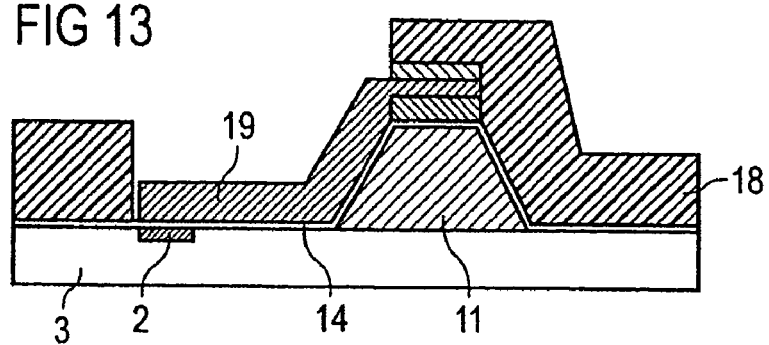
FIG. 13 shows a side view of the conductive connection after a third process step of the second exemplary embodiment of the invention.

In a second exemplary embodiment, the process steps shown in FIGS. 6D to 6F are replaced by the steps as are illustrated successively in FIGS. 11A–11B to FIG. 13.

As illustrated in FIGS. 11A–11B, the first resist mask 15 is removed and the region of the soldering island 5 is covered with the second resist mask 18. The window 20 frees the layer sequence 16 and a third strip 25—which runs around the layer sequence 16—on the surface of the nucleation layer 14 laterally with respect to the layer sequence 16. The width of the third strip 25 is approximately 5 μm to 10 μm.

As illustrated in FIGS. 12A–12B, the upper layer 17 and the nucleation layer 14 are subsequently removed in the window. The side areas of the conductive layer 9 and the first passivation layer 10 and, in the region of the third strip 25, the surface 7 are now uncovered. Thus, no nucleation layer 14 is situated in the third strip 25, which nucleation layer would bring about an electrolytic deposition upon application of an electrolysis voltage, while an electrolysis voltage can be applied to the region of the uncovered side areas of the conductive layer 9.

As illustrated in FIG. 13, the second passivation layer 19 is deposited electrolytically with contact-connection of the nucleation layer 14 with a potential of an electrolysis voltage. As a result, in the case of the conductive connection 1, the second passivation layer 19 is arranged on all the side areas of the interconnect 8.

Afterwards, the second resist mask 18 and the nucleation layer 14 are then removed, analogously to FIGS. 10A–10B.

In a third exemplary embodiment, the process steps shown in FIGS. 6D to 6F are replaced by the steps that are illustrated successively in FIG. 14 to FIG. 17.

Figure 14:
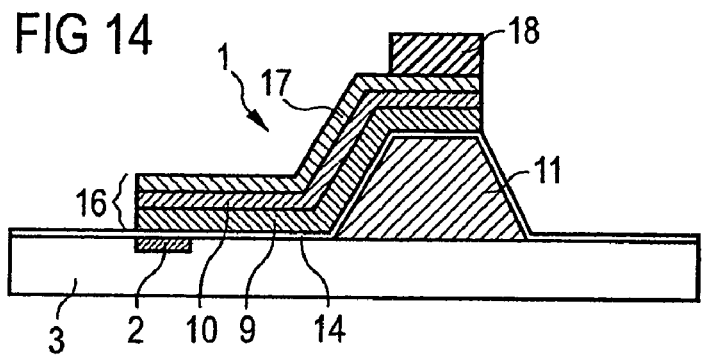
FIG. 14 shows a side view of the resulting conductive connection in a first process step of a third exemplary embodiment of the invention.
Figure 15:
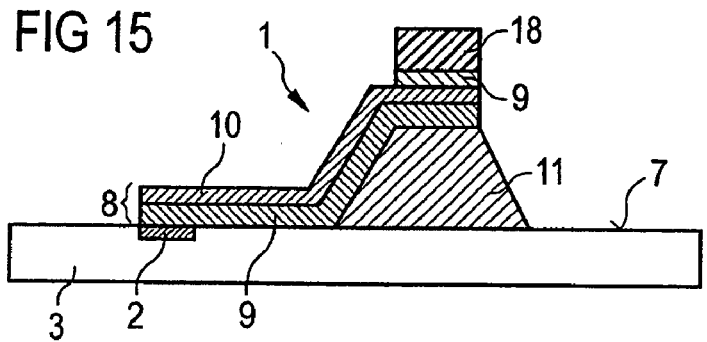
FIG. 15 shows a side view of the resulting conductive connection in a second process step of the third exemplary embodiment of the invention.

As illustrated in FIG. 14, the first resist mask 15 is removed and, with a second resist mask 18, the region of the soldering island 5 is covered and the layer sequence 16 and the adjoining surface of the nucleation layer 14 are left free. As illustrated in FIG. 15, the upper layer 17 and the nucleation layer 14 are subsequently removed in the uncovered regions.

Figure 16:
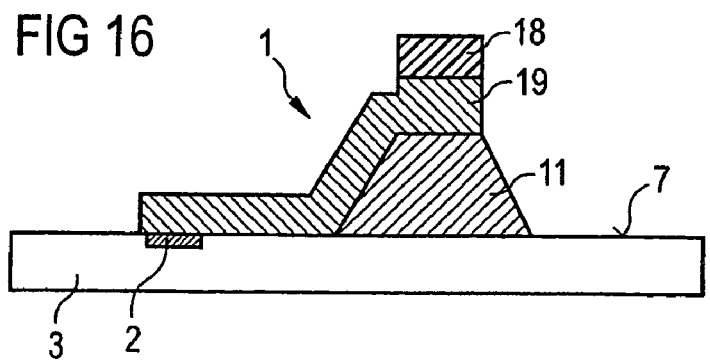
FIG. 16 shows a side view of the resulting conductive connection in a third process step of the third exemplary embodiment of the invention.

In accordance with FIG. 16, a second passivation layer 19 is then deposited, in particular at the side areas of the interconnect 8. The deposition of the second passivation layer 19 is effected in a manner free of voltage i.e. free of an application of an electrolysis voltage (electroless plating).

As shown in FIGS. 17A–17B, the second resist mask 18 is then finally removed.

As a result, in the case of the conductive connection 1, the second passivation layer 19 is arranged on all the side areas of the interconnect 8.

Although the present invention and its advantages have been described in detail, it should be understood that various changes, substitutions and alterations can be made herein without departing from the spirit and scope of the invention as defined by the appended claims.

What is claimed is:

1. A method for producing a conductive connection between a semiconductor chip and an external conductor structure, the method comprising:
    forming an elevation element on a semiconductor wafer at a surface of the semiconductor chip;
    depositing a nucleation layer on the elevation element and a remaining surface of the semiconductor wafer at least in a region where the conductive connection is to be produced;
    forming a first mask to expose a portion of the nucleation layer where the conductive connection is to be produced;
    forming a conductive layer over exposed portions of the nucleation layer;
    forming a first passivation layer over the conductive layer;
    forming an upper layer over the first passivation layer, the upper layer comprising a material of a soldering island;
    covering the soldering island of the upper layer with a second resist mask;
    removing portions of the upper layer that are not covered; and
    forming a second passivation layer such that sides of the conductive layer are covered with the second passivation layer at least in a region adjacent the soldering island.

2. The method of claim 1 wherein the second resist mask covers the semiconductor wafer at least in the region of the conductive connection to be produced except for a window that exposes the upper layer and first and second strips of the nucleation layer that are adjacent the upper layer, the window overlying at least a sloped region of the elevation, the method further comprising:
    removing portions of the upper layer and the nucleation layer that are exposed by the window;
    depositing the second passivation layer in the window including at the sides of the conductive layer; and
    removing the second resist mask and portions of the nucleation layer.

3. The method of claim 2 wherein the second resist mask covers the region of the soldering island and the window exposes at least upper layer and a third strip that surrounds the upper layer and encloses the first and second strips on the surface of the nucleation layer laterally with respect to the upper layer.

4. The method of claim 2 wherein the first strip or the second has a width that is wider than a width of the conductive layer.

5. The method of claim 4 wherein the width of the first strip or the second strip is between 5 μm and 10 μm.

6. The method of claim 1 wherein the second passivation layer, with contact-connection of the nucleation layer with a potential of an electrolysis voltage, is deposited electrolytically at the side areas of the conductive layer.

7. The method of claim 1 wherein the second resist mask covers a region of the soldering island and exposes the upper layer and an adjoining surface of the nucleation layer, and wherein exposed portions of the upper layer and the nucleation layer are removed and then the second passivation layer is deposited, and then the second resist mask and portions of the nucleation layer are removed.

8. The method of claim 7 wherein the deposition of the second passivation layer is effected in a manner free of voltage using an electroless plating process.

9. A method of making a semiconductor device, the method comprising:
  providing a semiconductor chip;
  forming an elevation element on an upper surface of the semiconductor chip;
  forming a soldering island on the elevation element, the soldering island comprising a readily solderable non-oxidizing metal;
  forming a contact region at the upper surface of the semiconductor chip;
  forming an interconnect that is electrically conductively connected from the soldering island to the contact region, the interconnect comprising a conductive layer and a conductive first passivation layer deposited over the conductive layer such that the soldering island is arranged over the conductive first passivation layer; and
  forming a second passivation layer at sides of the interconnect at least in a region adjacent the soldering island.

10. The method of claim 9 wherein forming a soldering island comprises forming a soldering island that comprises gold.

11. The method of claim 9 wherein forming an interconnect comprises forming an interconnect that lies below the soldering island and runs right over the contact region.

12. The method of claim 9 wherein forming a second passivation layer comprises forming a passivation layer that is arranged at a slope region of the elevation element.

13. The method of claim 9 wherein forming a second passivation layer comprises forming a passivation layer that is arranged on all side areas of the interconnect.

* * * * *